United States Patent [19]

Suzuki et al.

[11] Patent Number: 4,974,240
[45] Date of Patent: Nov. 27, 1990

[54] CHARGE-COUPLED DEVICE FLOATING DIFFUSION OUTPUT RESET

[75] Inventors: Junya Suzuki, Kagoshima; Kaneyoshi Takeshita, Tokyo, both of Japan

[73] Assignee: Sony Corporation, Tokyo, Japan

[21] Appl. No.: 515,676

[22] Filed: Apr. 26, 1990

Related U.S. Application Data

[63] Continuation of Ser. No. 824,836, Feb. 3, 1986, abandoned.

[30] Foreign Application Priority Data

Feb. 6, 1985 [JP] Japan .................................. 60-15536

[51] Int. Cl.$^5$ ........................ G11C 19/28; H01L 29/78
[52] U.S. Cl. ......................................... 377/60; 357/24
[58] Field of Search ...................... 357/24; 377/57–63, 377/824, 836

[56] References Cited

U.S. PATENT DOCUMENTS 4,093,872  6/1978  Hartman et al. ...................... 377/60

FOREIGN PATENT DOCUMENTS 56-32764  4/1981  Japan ................................. 357/24 M
57-13764  1/1982  Japan ................................. 357/24 M

OTHER PUBLICATIONS

Erb et al., "An Overlapping Electrode Buried Channel CCD" IEEE Int. Electron Devices Meeting (12/73), Tech. Dig. pp. 24–26.

Primary Examiner—Gene M. Munson
Attorney, Agent, or Firm—Ronald P. Kananen

[57] ABSTRACT

A charge-coupled device including a semiconductor substrate of given conductivity type, a buried channel formed on the substrate of different conductivity type than the substrate, an electrically floating diffusion formed in the substrate of different conductivity type than the substrate, and a plurality of electrodes insulating from the buried channel. The electrodes are responsive to applied voltages for supplying a signal charge through the buried channel to the floating diffusion. The charged-coupled device also includes a transistor responsive to a pulse voltage signal for periodically resetting the floating diffusion to a predetermined potential. The transistor comprises an enhancement type surface channel field effect transistor.

9 Claims, 2 Drawing Sheets

CHARGE-COUPLED DEVICE FLOATING DIFFUSION OUTPUT RESET

This application is a continuation of application Ser. No. 06/824,836, filed Feb. 3, 1986, now abandoned.

BACKGROUND OF THE INVENTION

This invention relates to a charge-coupled device for use in solid image pickup devices, delay devices, memory devices, or the like and more particularly, to a buried channel charge-coupled device. Still more particularly, this invention relates to a buried channel charge-coupled device which includes an enhancement type, surface channel, field effect transistor for resetting a floating diffusion region to a predetermined potential.

Such buried channel charge-coupled devices are well known in the art. For example, at page 47 in an article entitled "Charge Transfer Device", published 1978 by Kidai Kagaku Sha, there is described a charge-coupled device used in a floating diffusion amplifier for use as a signal charge detecting circuit which comprises a semiconductor substrate, a buried channel formed on the substrate, and an output circuit comprised of a floating diffusion region. Clock pulse voltages are applied to respective transfer gate electrodes so as to transfer a signal charge through the transfer channel. An output gate is connected to supply the transferred signal charge into the floating diffusion region. A charge sensing circuit senses the voltage level of the floating diffusion region. The floating diffusion region is also a part of a precharge transistor which periodically resets the floating diffusion region to a predetermined potential in response to a reset pulse voltage signal.

In such conventional buried channel charge-coupled devices, however, the precharge transistor has been provided in the form of a buried channel MOSFET which can only be driven by a reset pulse signal having a relatively great amplitude. In order to drive the precharge transistor in response to the output of a digital timing generator, therefore, a driver circuit is required to boost the reset pulse voltage signal outputted from the digital timing generator.

Accordingly, it is a problem with such a floating diffusion amplifier to provide a charge-coupled device which includes a charge sensing circuit that can be reset with a lower reset pulse voltage without a driver circuit for amplifying the pulse reset signals from a digital timing source.

SUMMARY OF THE INVENTION

A main object of the present invention is to provide an improved charge-coupled device which can operate on a smaller reset pulse signal.

Another object of the present invention is to minimize the influence of power source voltage fluctuations on the operation of the charge-coupled device.

There is provided, in accordance with the present invention, a charge-coupled device which includes a semiconductor substrate of a given conductivity type, a buried channel formed on the substrate and of different conductivity type than the substrate, an electrically floating diffusion region formed in the substrate of a different conductivity type than the substrate, and a plurality of electrode means insulated from the buried channel. The electrode means are responsive to an applied voltage for supplying a signal charge through the buried channel to the floating diffusion region. The charge-coupled device also includes a transistor responsive to a pulse voltage signal for periodically resetting the floating diffusion region to a predetermined potential. The transistor comprises an enhancement type surface channel field effect transistor.

BRIEF DESCRIPTION OF THE DRAWINGS

The present invention will be described in greater detail by reference to the following description taken in connection with the accompanying drawings, in which.

DETAILED DESCRIPTION OF THE PREFERRED EMBODIMENT

Figure 1:
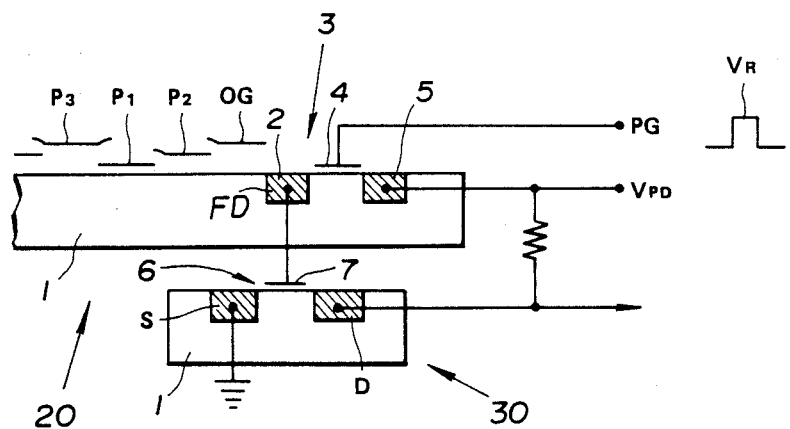
FIG. 1 is a schematic cross-sectional view showing a conventional buried channel charge-coupled device.

Prior to the description of the preferred embodiment of the present invention, the prior art charge-coupled device of FIG. 1 is briefly described in order to provide a basis for a better understanding of the difficulties attendant therewith.

In the conventional floating diffusion amplifier (FDA) of FIG. 1, designated generally by the reference numeral 20, three-phase clock pulse voltages $\phi 1$, $\phi 2$ and $\phi 3$ are applied to respective transfer gate electrodes P1, P2, and P3 so as to transfer a signal charge Qsig through a transfer channel formed on a silicon substrate 1. An output gate OG is connected to supply the transferred signal charge into the floating diffusion (FD) region 2 which constitutes the output circuit of the FDA 20. The floating diffusion region FD 2 is connected to a charge sensing circuit, designated generally by the reference numeral 30. The charge sensing circuit 30 includes a MOSFET 6 which includes a gate electrode 7, a source electrode S connected to a reference potential, such as ground, and a drain electrode D. The gate electrode 7 is connected to the floating diffusion region FD 2 for sensing the voltage level of the floating diffusion region FD 2 into which the signal charge Qsig is supplied.

The floating diffusion region FD is also part of a precharge transistor 3. The precharge transistor includes the floating diffusion region FD 2 as a source electrode, a drain electrode 5 held at a predetermined potential $V_{PD}$ and a gate electrode 4. A series of reset voltage pulses $V_R$ is applied from a reset pulse generator to the gate electrode 4 via a precharge gate input electrode PG to periodically turn on the precharge transistor so as to reset the floating diffusion region FD to a predetermined potential applied to the precharge drain electrode 5. Thus, the potential of the floating diffusion region FD 2 becomes the same as the preset potential $V_{PD}$ on the precharge drain 5 whenever the precharge transistor 3 is turned on by the gate potential $V_R$. The reset pulse generator may be a digital timing generator such as one comprising a TTL, CMOS, or the like. The precharge transistor 3 remains off so as to separate the floating diffusion region FD 2 from the drain 5 until a signal charge Qsig is supplied to the floating diffusion region FD 2.

In the case of an application of such a charge sensing circuit of FIG. 1 to buried channel charge-coupled devices (BCCD's), it is the conventional practice to make the precharge transistor 3 in the form of a buried channel MOSFET. In order to operate the buried channel MOSFET, however, the reset pulse voltage $V_R$ should have an amplitude greater than about 7.5 volts. This requires a driver circuit which can boost the normal output voltage (about 5 volts) from the reset pulse generator to a level sufficient to operate the precharge transistor 3.

Figure 2:
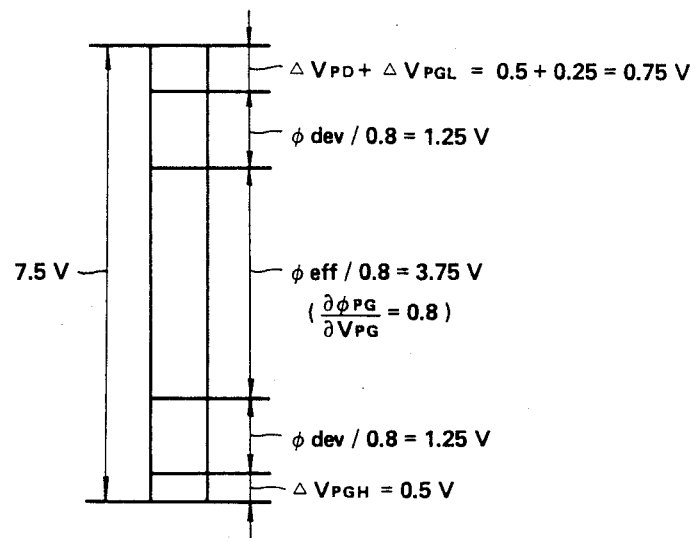
FIG. 2 is a diagram showing the details of the total amplitude of the reset pulse voltage required to operate the conventional buried channel charge-coupled device.

FIG. 2 is a diagram showing the details of the voltage components of the total amplitude of the reset pulse voltage $V_R$ required to operate the conventional buried channel charge-coupled device (BCCD). In FIG. 2, the item $(\partial \phi_{PG}/\partial V_{PG})$ indicates the channel potential gain with respect to the gate voltage., the channel potential gain is 0.8 for buried channel MOSFET's. The total amplitude of the reset pulse voltage $V_R$ is thus made up by the following components:

(1) a first component corresponding to a voltage ($\phi$eff) required to reset the floating diffusion region FD 2 and represented as the sum of (a) a signal amplitude, (b) a coupling amplitude induced from the gate electrode 4 to the floating diffusion region FD, and (c) a potential differential required to reset the floating diffusion region FD in its linear region. This component is calculated as eff/$(\partial \phi_{PG}/\partial V_{PG})$ = (1.0 + 1.0 + 1.0)/0.8 = 3.75 volts.

(2) a second component corresponding to a buried channel potential deviation ($\phi$dev) produced in the course of formation of the buried channel by ion implantation, diffusion, and the like. This deviation is +1.0 volts and this component is calculated as $\phi$dev/$(\partial \phi_{PG}/\partial V_{PG})$ — 1.0/0.8 = 1.25, and appears twice in the total reset potential.

(3) a third component corresponding to a fluctuation ($\Delta V_{PD}$) of the voltage applied to the drain electrode. This fluctuation is 0.5 volts.

(4) a fourth component corresponding to a fluctuation ($\Delta V_{PGH}$) of the gate electrode bias voltage. This fluctuation is 0.25 volts.

(5) a fifth component corresponding to a fluctuation ($\Delta V_{PGH}$) of the amplitude of the voltage applied to the gate electrode 4. This fluctuation is 0.5 volts.

Thus, the total amplitude is calculated as 3.75 + 2 × 1.25 + 0.5 + 0.25 + 0.5 = 7.5 volts.

Figure 3:
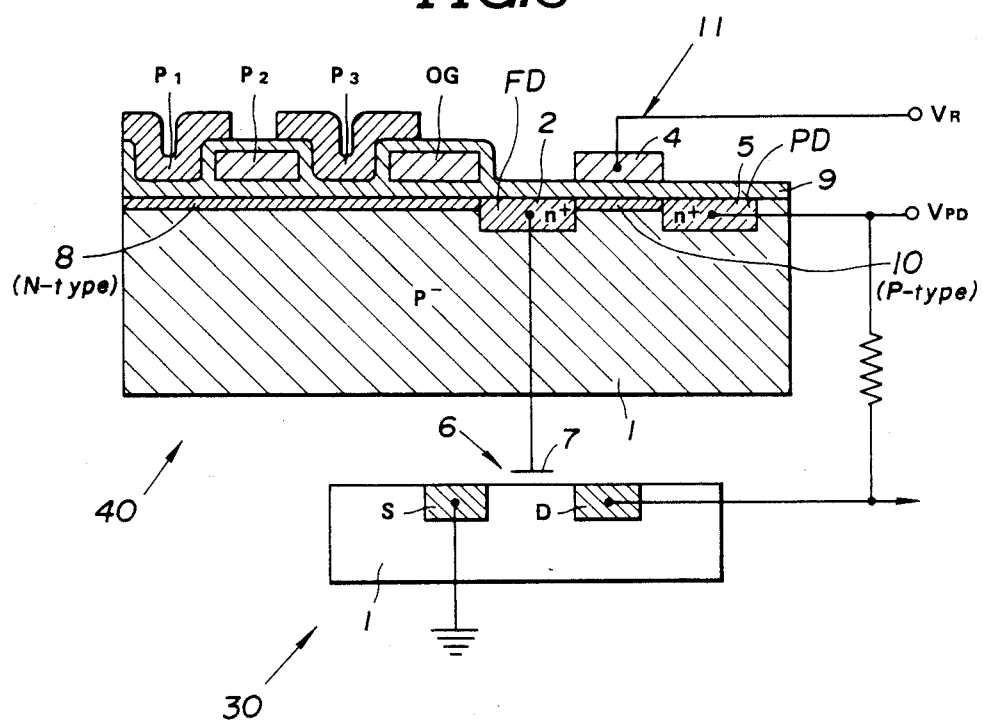
FIG. 3 is a cross-sectional view showing one embodiment of a charge-coupled device made in accordance with the principles of the present invention.

Referring to FIG. 3, the buried channel charge-coupled device according to the invention is designated by the reference numeral 40 and is shown as comprising a P-type silicon substrate 1 and a buried channel (transfer channel) 8 taken in the form of a very thin N-type silicon layer on the surface of the P-type substrate 1. A plurality of transfer gate electrodes P1, P2 and P3 and an output gate electrode OG are spaced the same distance from the substrate 1 by an insulating layer such as one formed of silicon dioxide. In practice, a number of transfer gate electrodes are arranged along the buried channel 8. The transfer gate electrodes P1, P2 and P3 are driven by three-phase clock pulse voltages $\phi 1$, $\phi 2$ and $\phi 3$. The output circuit of the buried channel charge-coupled device 40, which is also part of a precharge transistor 11, includes a floating n+ diffusion region FD 2 formed in the substrate 1 at one end of the buried channel 8. The floating n+ diffusion region FD 2 is connected to the gate electrode 7 of the sense MOSFET 6 of the charge sensing circuit 30. The charge sensing circuit 30 is substantially identical to that shown with the conventional floating diffusion amplifier (FDA) 20 described in connection with FIG. 1 and will not be described further. All the structure shown in FIG. 3 may be integrated on a common substrate 1.

The precharge transistor 11 is provided in the form of an enhancement type surface channel field effect transistor which includes the floating diffusion region FD as a source electrode 2, a drain electrode 5, and a precharge gate electrode 4. The source electrode 2 thus comprises the floating n+ diffusion region FD. The drain electrode comprises a precharge drain n+ diffusion region PD in the substrate 1. The drain electrode 5 is connected to a source of a predetermined voltage $V_{PD}$. The precharge transistor 11 also includes a surface channel 10 which comprises a P-type silicon layer extending over the P-type silicon substrate 1 between the floating n+ diffusion region FD and the precharge drain n+ diffusion region PD. The surface channel 10 may be formed by P-type impurity ion implantation. The gate electrode 4 of the precharge transistor 11 is formed on the insulating layer 9 above the P-type layer 10. The precharge gate electrode 4 is connected to a source of reset pulse volta $V_R$.

In operation, three-phase clock pulse voltages $\phi 1$, $\phi 2$, and $\phi 3$ are applied to the respective transfer electrodes P1, P2 and P3 so as to transfer a signal charge Qsig through the transfer channel 8. The output gate electrode OG controls the flow of the signal charge Qsig into the floating diffusion region FD. The charge sensing circuit is connected to and senses the voltage level of the floating diffusion region FD into which the signal charge Qsig is supplied. The output voltage Vout is represented as:

$$V_{out} = Qsig/C_{FD}$$

where $C_{FD}$ is the total capacitance of the floating diffusion region FD.

A series of reset voltage pulses $V_R$ is applied to the gate electrode 4 of the precharge transistor 11 which thereby is turned on periodically so as to reset the floating diffusion region FD to a predetermined potential applied to the drain electrode 5. It is to be understood that the precharge transistor 11 remains off to provide electrical separation between the floating diffusion region FD and the drain diffusion region PD until a signal charge Qsig is supplied into the floating diffusion region FD.

Figure 4:
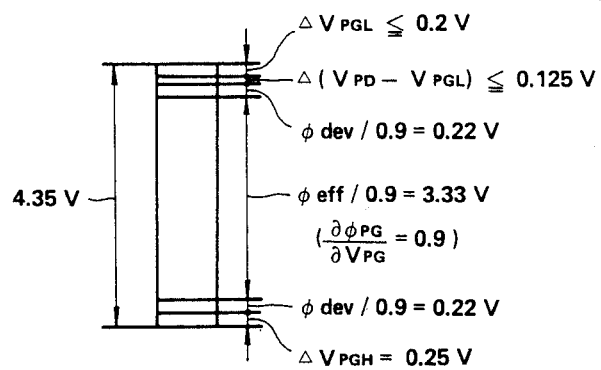
FIG. 4 is a diagram showing the pulse voltage signal required to operate the charge-coupled device of the present invention.

FIG. 4 is a diagram, similar to FIG. 2, showing the details of the total amplitude of the reset pulse voltage $V_R$ required to operate the buried channel charge-coupled device (BCCD) of the present invention which employs a surface channel field effect transistor. In this case, the channel potential gain $(\partial \phi_{PG}/\partial V_{PG})$ is 0.9. The total amplitude is made up by the following components:

(1) a first component corresponding to a voltage ($\phi$eff) required to reset the floating diffusion region FD. This component is calculated as $\phi$eff/$(\partial \phi_{PG}/\partial V_{PG})$ = 3.0/0.9 = 3.33 volts which is smaller than the component (3.75 volts) required for a buried channel MOSFET, as in FIGS. 1 and 2.

(2) a second component corresponding to a deviation ($\phi$dev) produced in the course of formation of the surface channel. This deviation can be reduced to 0.2 volts which is smaller than the deviation ($\pm$1.0 volts) produced for a buried channel FET. This component is calculated as $\phi$dev/$(\partial \phi_{PG}/\partial V_{PG})$ = 0.2/0.9 = 0.22 volts. And, like the corresponding component of FIG. 2, this component is counted twice in the total potential.

(3) a third component corresponding to a fluctuation ($\Delta V_{PD}$) of the amplitude of the voltage applied to the gate electrode 4. This fluctuation is 0.25 volts.

(4) a component corresponding to power source voltage fluctuation.

The last component will be described in greater detail. For a buried channel FET, the gate electrode bias voltage ($V_{PGL}$) is somewhat lower than the voltage ($V_{PD}$) applied to the drain electrode. Consequently, the gate electrode bias voltage should be obtained from a voltage source separated from the gate electrode bias voltage source. This is the reason why both the gate electrode bias voltage fluctuation, ($\Delta V_{PGL}$) and the fluctuation ($\Delta V_{PD}$) of the voltage applied to the drain electrode are added to the total amplitude of the required reset pulse $V_R$ in the diagram of FIG. 2. For the surface channel FET used in the BCCD of the present invention, on the other hand, the gate electrode bias voltage ($V_{PGL}$) is substantially equal to the voltage ($V_{PD}$) applied to the drain electrode. This permits the use of a common power source to provide necessary potentials at the gate and drain electrodes so as to minimize the margin for power source voltage fluctuations.

In this embodiment, a common voltage source may be connected to provide a predetermined potential at the drain electrode and also a bias potential at the gate electrode. For example, the gate electrode bias voltage ($V_{PGL}$) may be obtained by connecting the gate electrode directly to the source of the voltage ($V_{PD}$) applied to the drain electrode. In this case, the fluctuation of the voltage ($V_{PGL}$), which completely follows the voltage ($V_{PD}$), is 0 volt and the total amplitude of the required reset pulse voltage is calculated as $3.33 + 0.22 \times 2 + 0.25 = 4.02$ volts.

Alternatively, the voltage ($V_{PGL}$) may be obtained by connecting the gate electrode through a p-n diode to the source of the voltage ($V_{PD}$). In this case, the gate electrode bias voltage variation ($V_{PGL}$) is 0.1 volts which is produced due to a diode forward voltage change caused by a temperature change and the total amplitude is calculated as $3.33 + 0.22 \times 2 + 0.25 + 0.1 = 4.12$ volts.

Furthermore, the voltage ($V_{PGL}$) may be obtained by connecting the gate electrode to the junction of two resistors of a voltage divider circuit connected across the source of voltage ($V_{PD}$), the values of the resistors being chosen such that the voltage ($V_{PGL}$) applied to the gate electrode is equal to or greater than $(\frac{3}{4}) \times V_{PD}$. In this case, the value of $\Delta(V_{PD} - V_{PGL})$ is represented as:

$$\Delta(V_{PD} = V_{PGL}) \leqq 1/4 \times V_{PD}$$
$$= 1/4 \times (+0.5)$$
$$= +0.125$$

and the value of $\Delta V_{PGL}$ is 0.2 volts. Consequently, the total amplitude of the required reset pulse voltage is calculated as $3.33 + 0.22 \times 2 + 0.25 + 0.25 + 0.2 = 4.35$ volts.

In either of the cases, the required reset pulse voltage is three volts smaller than required in conventional charge-coupled devices employing a buried channel field effect transistor and also is smaller than five volts which is the amplitude of the reset pulse signal outputted from the digital timing generator using a TTL, CMOS, or the like. It is, therefore, possible to eliminate the need for a driver circuit required in conventional charge-coupled devices.

It is, therefore, apparent from the foregoing that there has been provided, in accordance with the present invention, a charge-coupled device which is operable on a smaller reset pulse signal and is subject to less influence of channel potential fluctuations that fully satisfies the objects, aims and advantages set forth above. While this invention has been described in conjunction with a specific embodiment, therefore, it is evidence that many alternatives, modifications and variations will be apparent to those skilled in the art. For example, the charge-coupled device can be operated by any practical number of phases. In addition, the charge-coupled device can have a P- or an N-type substrate. Accordingly, it is intended to embrace all alternatives, modifications and variations that fall within the scope of the appended claims.

What is claimed is:

1. A charge-coupled device comprising:
   a semiconductor substrate of a given conductivity type;
   a buried channel formed on said substrate, said buried channel being formed of a different conductivity type than said substrate;
   an electrically floating diffusion region formed in said substrate, said floating diffusion region being of a different conductivity type than said substrate;
   a plurality of electrode means insulated from said buried channel, said electrode means being responsive to applied voltage for applying a signal charge through said buried channel to said floating diffusion region;
   a transistor responsive to a pulse voltage signal for periodically resetting said floating diffusion region to a predetermined potential, said transistor comprising a source electrode including said floating diffusion region, a drain electrode including a drain diffusion region formed in said substrate, said drain diffusion region being of a different conductivity type than said substrate, a gate electrode connected to a source of said pulse voltage signal, and a surface channel formed on said substrate, said surface channel being of the same conductivity type as said substrate, said surface channel extending between said source and drain electrodes; and
   a common voltage source connected to provide substantially equal potentials about equal to said predetermined potential at both said drain electrode and also said gate electrode, to minimize the margin for power source fluctuations.

2. In a floating diffusion amplifier of the type which comprises a plurality of transfer gate electrodes for respectively receiving clock pulse signals to transfer a signal charge through a transfer channel formed on a semiconductor substrate of a given conductivity type; an output gate connected to supply transferred charge to a floating diffusion region of a different conductivity type than said substrate and comprising an output circuit of the floating diffusion amplifier; a charge sensing circuit operatively connected to said floating diffusion region which includes a sensing transistor connected for sensing the voltage level of the floating diffusion region into which said signal charge is supplied; a pre-charge transistor operatively connected to receive a series of reset pulse voltage signals to periodically turn on said pre-charge transistor to reset the floating diffusion region to a predetermined potential applied to said electrode, said precharge transistor including a source electrode comprising the floating diffusion region, a drain electrode comprising a pre-charge drain diffusion region formed in said substrate, said drain diffusion region being of a different conductivity type than said substrate, and a gate electrode operatively connected to a source of reset voltage pulses to reset periodically the floating diffusion region to said predetermined potential, and a surface channel being of the same conductivity type as said substrate, said surface channel extending between said source and drain electrodes; and a common voltage source connected to provide said predetermined potential at said drain electrode and also to provide a gate electrode bias potential at said gate electrode, about equal to said predetermined potential.

3. The amplifier as set forth in claim 2, wherein said substrate comprises a P-type silicon substrate, said transfer channel is an N-type silicon layer on said P-type substrate, and said pre-charge transistor includes an N-type floating diffusion region formed as a source electrode in said substrate at one end of said transfer channel.

4. The amplifier as set forth in claim 3, wherein said pre-charged transistor includes a drain electrode of N-type diffusion and a P-type silicon channel extending over the P-type silicon substrate between the N-type diffusion and the pre-charge drain N-type diffusion.

5. A charge-coupled device comprising:
a semiconductor substrate of a given conductivity type;
a buried channel formed on said substrate, said buried channel being formed of a different conductivity type than said substrate;
an electrically floating diffusion region formed in said substrate, said floating diffusion region being of a different conductivity type than said substrate;
a plurality of electrode means insulated from said buried channel, said electrode means being responsive to applied voltage for applying a signal charge through said buried channel to said floating diffusion region;

a transistor responsive to a pulse voltage signal for periodically resetting said floating diffusion region to a predetermined potential, said transistor comprising a source electrode including said floating diffusion region, a drain electrode including a drain diffusion region formed in said substrate, said drain diffusion region being of a different conductivity type than said substrate, a gate electrode connected to a source of said pulse voltage signal, and a surface channel formed on said substrate, said surface channel being of the same conductivity type as said substrate, said surface channel extending between said source and drain electrodes; and means for providing a bias potential to said gate electrode of said transistor which is about equal to said predetermined potential applied to said drain electrode of said transistor, said bias potential providing means including a common power source to provide said bias and said predetermined potential to minimize the margin for power source voltage fluctuations.

6. The charge-coupled device as set forth in claim 5, wherein said common power source is a common voltage source connected directly to said gate electrode and to said source electrode.

7. The charge-coupled device as set forth in claim 5, wherein said common power source is a common voltage source; and a p-n diode connecting said gate electrode to said common voltage source.

8. The charge-coupled device as set forth in claim 5, wherein said common power source is a common voltage source; and further comprising a voltage divider circuit having at least two resistors, said voltage divider being connected across said voltage source, the gate electrode of said transistor being connected to a junction between said two resistors.

9. The charge-coupled device as set forth in claim 8 wherein the value of the resistors in said voltage divider is chosen so that the voltage applied to the gate electrode of said transistor is equal to or greater than $\frac{3}{4}$ of the value of the voltage of said common voltage source.

* * * * *